(12) United States Patent
Viswanathan et al.

(10) Patent No.: US 10,147,698 B2
(45) Date of Patent: *Dec. 4, 2018

(54) RADIO FREQUENCY (RF) DEVICES

(71) Applicant: NXP USA, INC., Austin, TX (US)

(72) Inventors: Lakshminarayan Viswanathan, Phoenix, AZ (US); Michael Watts, Scottsdale, AZ (US)

(73) Assignee: NXP USA, INC., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/717,456

(22) Filed: Sep. 27, 2017

(65) Prior Publication Data

US 2018/0019222 A1 Jan. 18, 2018

Related U.S. Application Data

(63) Continuation of application No. 14/500,319, filed on Sep. 29, 2014, now Pat. No. 9,824,995.

(51) Int. Cl.
*H05K 7/00* (2006.01)
*H01L 23/00* (2006.01)
(Continued)

(52) U.S. Cl.
CPC .......... *H01L 24/49* (2013.01); *H01L 23/4985* (2013.01); *H01L 23/49838* (2013.01); *H01L 23/66* (2013.01); *H01L 24/37* (2013.01); *H01L 24/50* (2013.01); *H01L 24/73* (2013.01); *H01L 24/86* (2013.01); *H01L 23/057* (2013.01); *H01L 24/13* (2013.01); *H01L 24/16* (2013.01); *H01L 24/29* (2013.01); *H01L 24/32* (2013.01); *H01L 24/40* (2013.01); *H01L 24/48* (2013.01); *H01L 2224/131* (2013.01); *H01L 2224/16245* (2013.01); *H01L 2224/2919* (2013.01); *H01L 2224/32245* (2013.01); *H01L 2224/37599* (2013.01); *H01L 2224/40157* (2013.01); *H01L 2224/45099* (2013.01); *H01L 2224/48101* (2013.01); *H01L 2224/48106* (2013.01); *H01L 2224/48137* (2013.01); *H01L 2224/48157* (2013.01); *H01L 2224/49109* (2013.01); *H01L 2224/49176* (2013.01);
(Continued)

(58) Field of Classification Search
CPC .......... H05K 1/111; H05K 1/141–1/144; H01F 19/04; H01L 23/36
USPC .......... 361/749, 767–775, 803; 174/250–262
See application file for complete search history.

(56) References Cited

U.S. PATENT DOCUMENTS

| | | |
|---|---|---|
| 5,173,764 A | 12/1992 | Higgins, III |
| 5,365,656 A | 11/1994 | Dahringer et al. |

(Continued)

OTHER PUBLICATIONS

Fjelstad, J., "Flexible Circuit Technology: Third Edition", BR Publishing, Inc. (237 pages), 2006.
(Continued)

*Primary Examiner* — Tuan T Dinh

(57) ABSTRACT

A packaged RF device is provided that utilizes flexible circuit leads. The RF device includes at least one integrated circuit (IC) die configured to implement the RF device. The IC die is contained inside a package. In accordance with the embodiments described herein, a flexible circuit is implemented as a lead. Specifically, the flexible circuit lead is coupled to the at least one IC die inside the package and extends to outside the package, the flexible circuit lead thus providing an electrical connection to the at least one IC die inside the package.

20 Claims, 8 Drawing Sheets

(51) Int. Cl.
    *H01L 23/498*     (2006.01)
    *H01L 23/66*     (2006.01)
    *H01L 23/057*     (2006.01)

(52) U.S. Cl.
    CPC    *H01L 2224/50* (2013.01); *H01L 2224/73229* (2013.01); *H01L 2224/8384* (2013.01); *H01L 2224/83101* (2013.01); *H01L 2224/84801* (2013.01); *H01L 2924/00014* (2013.01); *H01L 2924/1421* (2013.01); *H01L 2924/161* (2013.01); *H01L 2924/19105* (2013.01); *H01L 2924/19107* (2013.01); *H01L 2924/30111* (2013.01)

(56) References Cited

U.S. PATENT DOCUMENTS

| | | |
|---|---|---|
| 5,383,787 A | 1/1995 | Switky et al. |
| 6,072,238 A | 6/2000 | Viswanathan et al. |
| 6,225,558 B1 | 5/2001 | Hur |
| 6,580,316 B2 | 6/2003 | Olofsson et al. |
| 6,791,842 B2 | 9/2004 | Hsin |
| 7,066,741 B2 | 6/2006 | Burns et al. |
| 7,747,116 B2 | 6/2010 | Furuyama |
| 8,254,144 B2 | 8/2012 | Matsumoto et al. |
| 8,716,606 B2 | 5/2014 | Kelley et al. |
| 8,773,866 B2 | 7/2014 | Jin et al. |
| 2004/0218372 A1 | 11/2004 | Hamasaki et al. |
| 2005/0190545 A1 | 9/2005 | Reznik et al. |
| 2006/0050493 A1 | 3/2006 | Hamasaki et al. |
| 2010/0090781 A1 | 4/2010 | Yamamoto et al. |

OTHER PUBLICATIONS

"Flex Circuit Surface Mount Technology (SMT)", Tech-Etch (2 pages), 2009.

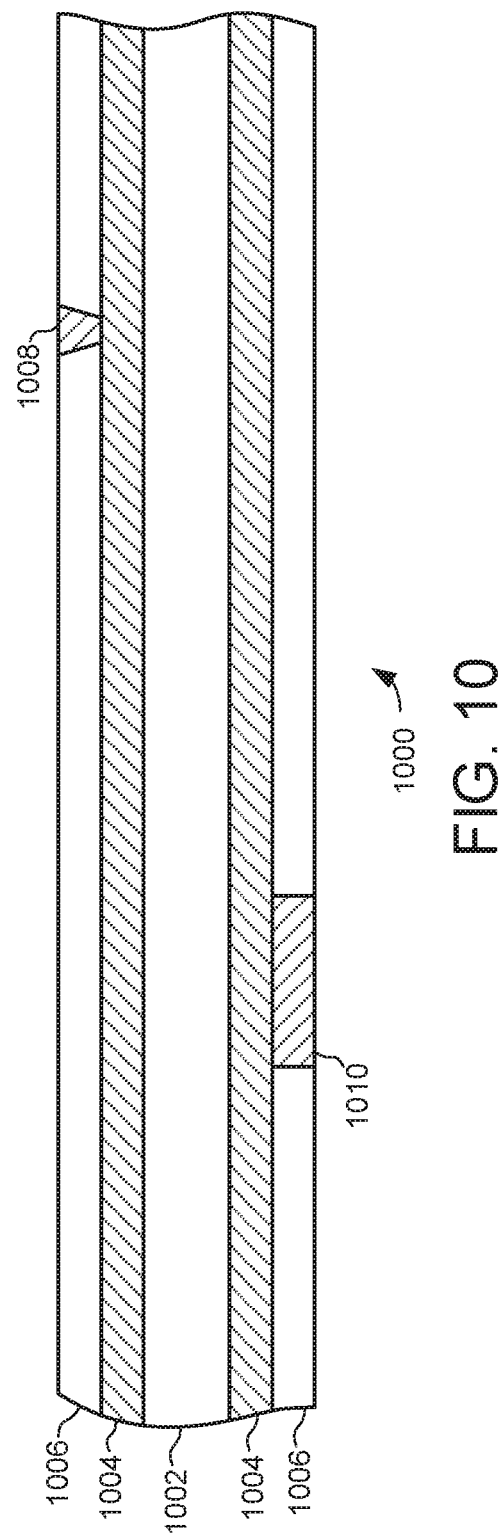

RADIO FREQUENCY (RF) DEVICES

RELATED APPLICATIONS

This application is a continuation of and claims priority to U.S. patent application Ser. No. 14/500,319, filed on Sep. 29, 2014, which is hereby incorporated by reference in its entirety.

TECHNICAL FIELD

Embodiments of the subject matter described herein relate generally to electronic devices, and more particularly to radio frequency (RF) semiconductor applications.

BACKGROUND

Radio frequency (RF) devices are used in a wide variety of applications, including increasingly common wireless communication systems. As the use of such RF devices proliferates, the cost of manufacturing such devices becomes increasingly important.

One issue with semiconductor devices, in general, and RF devices, specifically, is the limited space available for such devices. For example, in many RF devices the available space inside the device package is limited. This can limit the number of dies contained in the package and thus can limit the overall device. Additionally, the space available on each die is limited.

Another issue with some RF devices is the limited ability to customize such devices. For example, adding additional features to an RF device can require significant additional expense using traditional methods. This increased cost can limit the ability of an RF device fabricator to make relatively small runs of specialized devices to meet the needs of customers.

For these reasons, there is a continuing need for improved techniques in the manufacture and packaging of RF devices.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

FIG. 10 is a cross-sectional side view of a flexible circuit lead in accordance with an example embodiment.

DETAILED DESCRIPTION

In general, the embodiments described herein can provide improved performance and flexibility in radio frequency (RF) devices by using flexible circuits to implement package leads. For example, the use of the flexible circuits as package leads can significantly increase the performance of an RF device by allowing additional circuit elements to be located physically close to other device elements inside the package. For example, using flexible circuits as leads can facilitate the adding of impedance matching elements to the leads themselves. As another example, the use of the flexible circuits as package leads can significantly increase the ability to customize an RF device. For example, using flexible circuits as leads can facilitate the adding of specialized filters to the RF device to meet the needs of different users.

Figure 1:
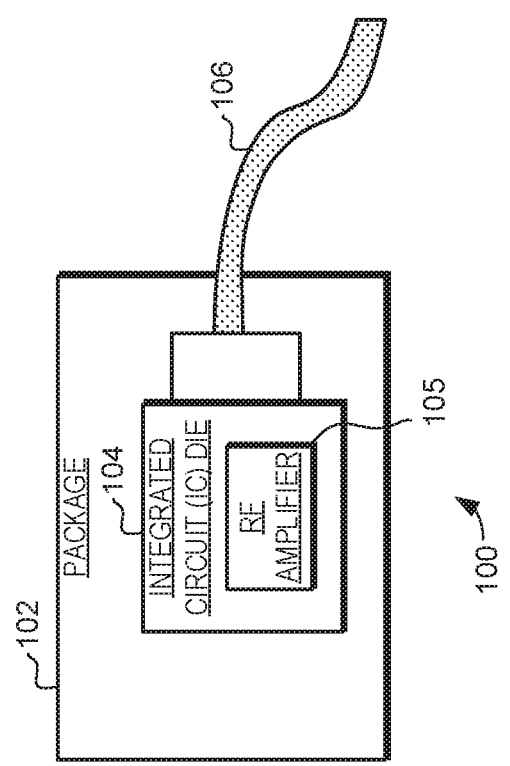
FIG. 1 is a block diagram of an RF device in accordance with an example embodiment.

FIG. 1 illustrates a block diagram of an RF device 100. The RF device 100 includes a package 102, an integrated circuit (IC) die 104, and a flexible circuit lead 106. In general, the package 102 serves to contain the IC die 104 and associated elements and provides the terminations (e.g., leads) that are used to connect the elements inside the package to external circuitry outside the package 102. The package 102 can include any suitable type of package, such as an air cavity package or over molded package. In an over molded package, the flexible circuit lead 106 would extend from inside the molding compound.

As one example, the package 102 can be a surface mount package that utilizes an array of surface mount leads in addition to the flexible circuit lead 106. In such cases, the flexible circuit lead 106 could extend to the bottom of the package for termination. As one more specific example, the package 102 can be a leaded surface mount package, such as a package that utilizes gull wing leads in addition to the flexible circuit lead 106. Again, it should be noted that in these embodiments the surface mount package could be an air cavity or overmolded package.

The IC die 104 serves to implement the RF device 100 and can include any suitable type of integrated circuit implementing RF amplifier 105. For example, IC die 104 can include a variety of different types of field effect transistors (FETs) commonly used in RF devices. Specific examples of the type of devices that can be provided in IC die 104 and RF amplifier 104 include single path amplifiers and multi-path amplifiers (e.g., amplifiers that include two, three, or more parallel amplification paths). Other examples include Doherty amplifiers, balanced power amplifier, unbalanced amplifiers, and push-pull amplifiers. Additionally, in some embodiments, multiple IC dies maybe included in the package 102. For example, in multipath RF amplifiers each path may have one or more IC dies 104 in each of multiple paths.

In general, the flexible circuit lead 106 can include any suitable type of flexible circuit implementation. For example, the flexible circuit lead 106 can include a suitable flexible base layer with one or more conductors formed of suitable conductive material. In a typical implementation, the flexible base layer comprises one or more flexible dielectric layers laminated together, and the conductors can be formed with one or more layers of conductive material that may be deposited as films or laminated to the flexible base material and then patterned. In other embodiments, the conductive material can printed on the flexible base layer. For example, metal conductors can be patterned on one side to form a single side flexible circuit, or can be formed on two sides to form a double sided flex circuit. In other embodiments, multi-layer designs can include additional layers of conductors, such as multiple layers embedded inside the flexible circuit. In such embodiments, the multiple layers can be connected with suitable vertical interconnects, including vias filled with conductive material.

In one implementation, flat conductors are sandwiched between layers of insulating flexible base material. For example, multiple layers of flexible base material and conductors can be laminated together. As one specific implementation, multiple films can be printed and patterned with conductive materials and then laminated together. Additionally, in this and other embodiments additional flexible cover layers can be applied over the conductors on one or both sides of the flexible circuit.

In some cases, the conductors can be used to form more complex devices on the flexible circuits. For example, passive devices such as capacitors and inductors can be formed in the flexible circuit. Such techniques may use sculpted circuit techniques to make conductors with different shapes and thicknesses.

A variety of different materials can be used for the flexible base layers. Some examples include polymers, such as polyester and polyimide. Other examples include thermoplastic films and flexible epoxies. Additionally, a variety of conductive materials can be used to form the conductors. Examples include both metallic foils and coatings made of materials such as copper or aluminum. Such conductive materials can be deposited with a variety of techniques, including electro-deposition, electro-plating, and sputtering.

To facilitate improved device performance and flexibility of the RF device 100, one or more devices can be formed in or mounted to the flexible circuit lead 106. As one example, a filter can be integrated into the flexible circuit lead 106. Such a filter could be a stop band filter, low bass filter, band pass filter, or high pass filter. Furthermore, such a filter could be implemented with integrated passive devices formed in the flexible circuit lead 106, with lumped passive elements mounted to the flexible circuit lead 106, or a combination thereof. So implemented, the flexible circuit lead can provide a filter to the input or output of the RF device 100. In one specific embodiment, that will be discussed in greater detail below, the filter can be used to provide a specified bandwidth for the RF device 100 to meet regulatory or other customer requirements without requiring more expensive changes to the IC die 104 or other elements that are interior to the package 102.

As another example, a transmission lines can be integrated into the flexible circuit lead 106. In such a device, the transmission line can include a plurality of gaps, with the spacing of the gaps varied to balance the current flow across the transmission line. Such transmission lines can lead to a more uniform feed of current into the RF device 100 and thus provide improved performance.

As another example, a distributed impedance matching circuit can be integrated into the flexible circuit lead 106. Such an impedance matching circuit could be implemented with integrated passive devices formed in the flexible circuit lead 106, with lumped passive elements mounted to the flexible circuit lead 106, or a combination thereof. So implemented the distributed impedance matching circuit can be used to provide an impedance transformation while saving available space inside the package 102. As another example, the flexible circuit lead 106 can be made to have reduced inductance compared to traditional leads.

As was described above, the flexible circuit lead 106 is coupled to the IC die 104 inside the package 102 and extends to outside the package 102. The flexible circuit lead 106 thus provides an electrical connection to the IC die 104. Stated another way, the flexible circuit lead 106 provides a termination used to connect the IC die 104 and other elements inside the package 102 to external circuitry outside the package 102. To accomplish this, the flexible circuit lead 106 can be connected in a variety of configurations and with a variety of different structures.

For example, in one embodiment, the package 102 includes an insulator, and the flexible circuit lead 106 is physically coupled to the insulator. In one embodiment the insulator can include a window frame and the flexible circuit lead 106 can be connected directly to the window frame. In other embodiments, the insulator can be mold compound. In either case, the insulator can separate the flexible circuit lead 106 from the package frame or flange. In such an embodiment, the flexible circuit lead 106 can be electrically connected to the IC die 104 using one or more wirebonds. In other embodiments, the flexible circuit lead 106 can be connected directly to the IC die 104.

Figure 2:
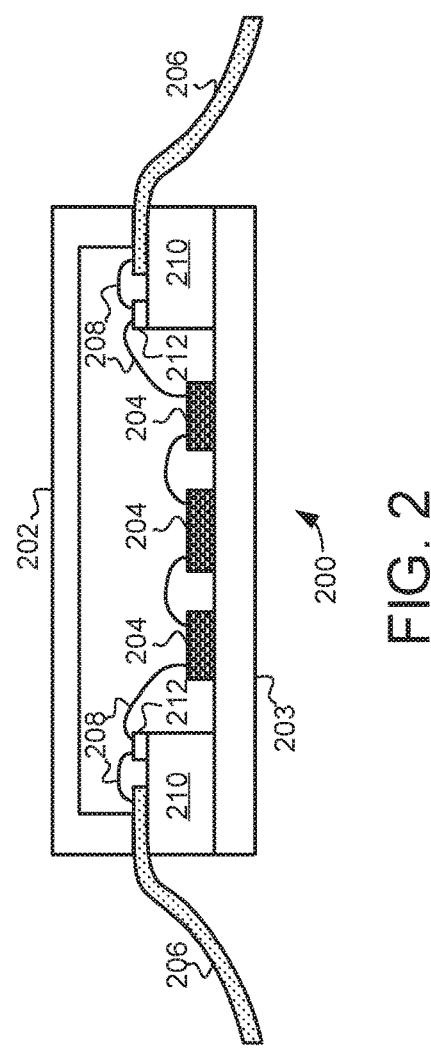
FIGS. 2, 3, and 4 are cross-sectional side views of exemplary RF devices in accordance with example embodiments.

Turning now to FIG. 2, a cross-sectional side view of an exemplary RF device 200 is illustrated. In this illustrated embodiment, the RF device 200 includes a package 202, IC dies 204, and flexible circuit leads 206. The package 202 includes a frame 203 and insulators 210. The frame 203 provides the substrate and ground connection on which the IC dies 204 are physically mounted. In the illustrated embodiment, the package 202 is an air cavity package, although it should be noted that this is just one example, and other embodiments are possible.

As described above, the flexible circuit leads 206 are coupled to the IC die 204 inside the package 202 and extend to outside the package 202. Thus, the flexible circuit leads 206 provide an electrical connection to the IC dies 204. In this embodiment, the flexible circuit leads 206 are physically coupled to the insulators 210. The electrical connection to the IC dies 204 is facilitated by wirebonds 208. Specifically, wirebonds 208 extend from the flexible circuit leads 206 to interposers 212, and then additional wirebonds 208 extend from the interposers to the IC dies 204. It should also be noted that additional wirebonds 208 connect between the different IC dies 204.

Thus, in this embodiment, the main physical connection of the flexible circuit leads 206 is to the insulators 210, while electrical connection is provided with wirebonds 208. Again, in this embodiment the wirebonds are connected first to interposers 212, and then additional wirebonds connect from the interposers 212 to the IC dies 204.

In such an embodiment, the flexible circuit leads 206 can by physically connected to the interposers 212 in a variety of ways. For example, the flexible circuit leads 206 can be glued to the interposer 212. Likewise, the electrical connection provided by the wirebonds 208 can be facilitated using any suitable wirebonding technique. As one detailed example, traces can be formed on the interposer 212, and the flexible circuit leads 206 can be wirebonded to these traces and then from these traces to the IC dies 204. In other embodiments, the flexible circuit leads 206 could be ribbon bonded between the flexible circuit leads 206, the interposers 212, and the IC dies 204.

Figure 3:
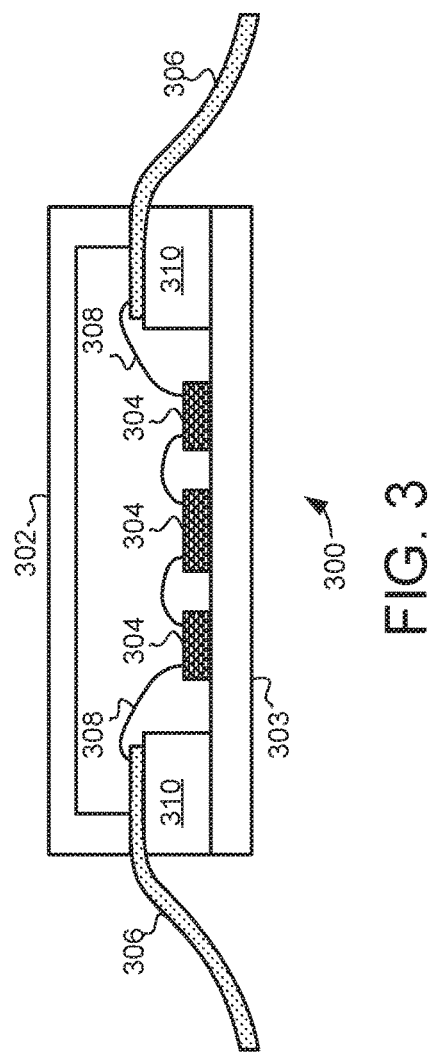

Turning now to FIG. 3, a cross-sectional side view of an exemplary RF device 300 is illustrated. In this illustrated embodiment, the RF device 300 includes a package 302, IC dies 304, and flexible circuit leads 306. The package 302 includes a frame 303 and insulators 310. The frame 303 provides the substrate and ground connection on which the IC dies 304 are physically mounted. In the illustrated embodiment, the package 302 is an air cavity package, although again it should be noted that this is just one example, and other embodiments are possible.

The flexible circuit leads 306 are coupled to the IC die 304 inside the package 302 and extend to outside the package 302. Thus, the flexible circuit leads 306 provide an electrical connection to the IC dies 304. In this embodiment, the flexible circuit leads 306 are again physically coupled to the insulators 310. Also in this embodiment, the electrical connection to the IC dies 304 is again facilitated by wirebonds 308. However, in contrast with the example of FIG. 2, the wirebonds 308 extend directly from the flexible circuit leads 306 to the IC dies 304. Thus, in this embodiment no additional wirebonds to and from an interposer are used.

Figure 4:
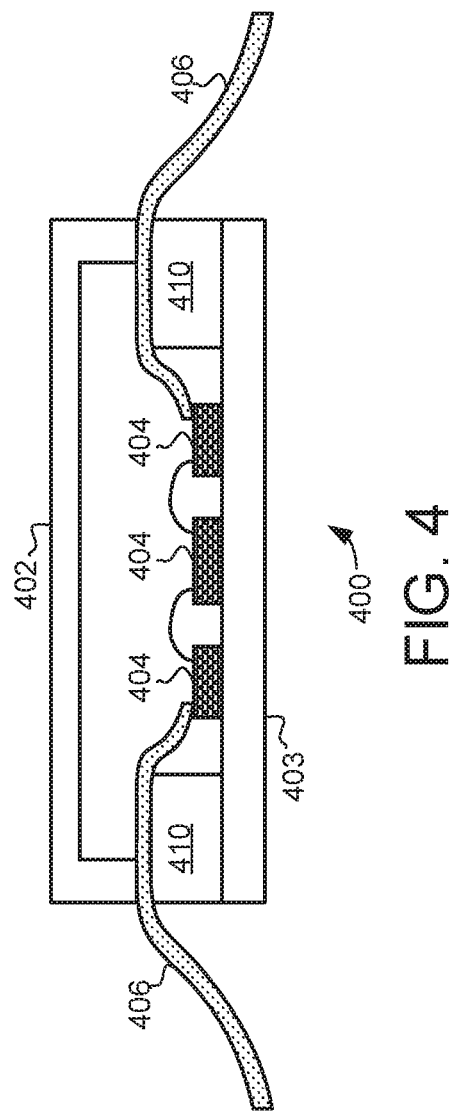

Turning now to FIG. 4, a cross-sectional side view of an exemplary RF device 400 is illustrated. In this illustrated embodiment, the RF device 400 includes a package 402, IC dies 404, and flexible circuit leads 406. The package 402 includes a frame 403 and insulators 410.

The flexible circuit leads 406 are coupled to the IC die 404 inside the package 402 and extend to outside the package 402. Thus, the flexible circuit leads 406 provide an electrical connection to the IC dies 404. In this embodiment, the flexible circuit leads 406 extend further and connect directly to the IC dies 404. Thus, no wirebonds are required to provide an electrical connection between the flexible circuit leads 406 and the IC dies 404.

The physical connection between the flexible circuit leads 406 and the IC dies 404 can be facilitated using any suitable technique. For example, the flexible circuit leads 406 can be glued to the IC dies. In other embodiments the flexible circuit leads 406 can be bonded with adhesive films, bumped systems, or solder. In such embodiments, the flexible circuit leads 406 can also be physically connected to the insulators 410, but this may not be required in all embodiments. The electrical connection between the flexible circuit leads 406 and the IC dies 404 can be provided using pads on the flexible circuit leads 406 and IC dies 404 and solder to connect the pads.

Figure 5:
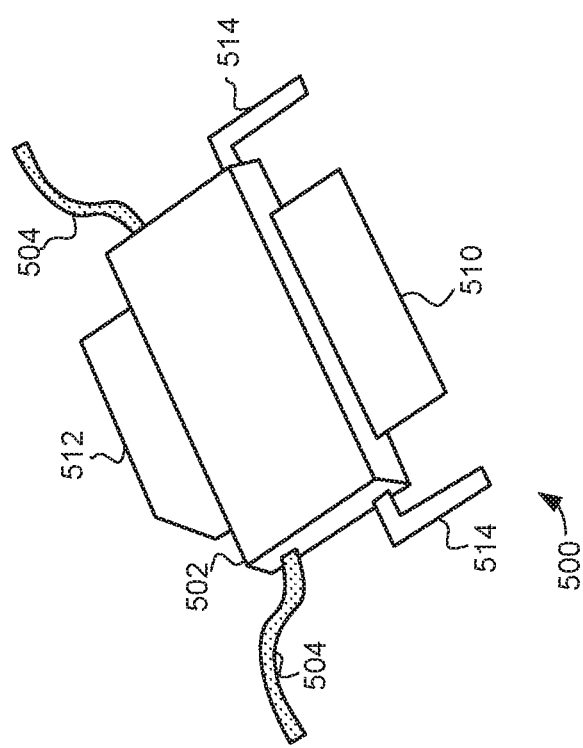
FIG. 5 is a perspective view of an RF device in accordance with example embodiments.

Turning now to FIG. 5, a perspective view of an RF device 500 is illustrated. In this embodiment the RF device 500 is contained in an overmolded package 502 that includes a plurality of leads 504, 510, 512, 514. The leads include RF input lead 510, RF output lead 512, first bias leads 504 (e.g., output-side bias leads), and second bias leads 514 (e.g., input-side bias leads). In accordance with the embodiments described herein, the first bias leads 504 are implemented with flexible circuit leads. So configured, the flexible circuit leads provide the ability to place specialized circuits and other features relatively close to the RF device 500. As described above, this can provide increased device performance and device flexibility. Specific examples of the specialized circuits and other features will now be discussed.

In a typical transmission line used for RF applications, the skin effect will cause the majority of the current will flow near the edges of the transmission line, with relatively small of amounts of current flowing in the middle. For example, the current across the transmission line can have a distribution that closely resembles an inverted parabola. Such an uneven distribution of current across the transmission line can reduce the performance of the RF device.

Figure 6:
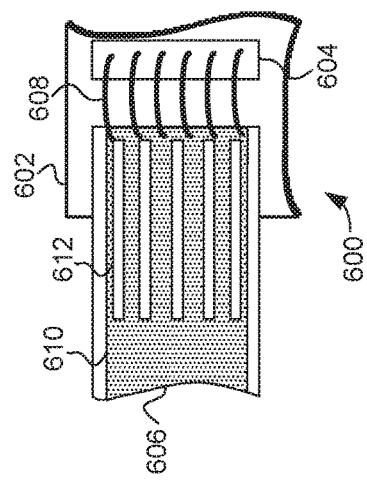

Turning now to FIG. 6, a schematic top view of a portion of an RF device 600 is illustrated. In this embodiment, the RF device 600 is contained in a package 602, of which a portion is illustrated. Inside the package 602 is an IC die 604. On the IC die 604 could be a variety of devices, including transistor dies, capacitors, and circuit boards on which RF components are formed. In accordance with the embodiments described herein, a flexible circuit lead 606 is coupled to the IC die 604, and used to provide an electrical connection to the IC die 604.

In the embodiment of FIG. 6, a transmission line 610 is provided in the flexible circuit lead 606. The transmission line 610 is provided with structures configured to more uniformly spread the current. Specifically, in the illustrated embodiment the flexible circuit lead 604 includes a transmission line 610 formed to have a plurality of gaps 612 near the end that is coupled to the IC die 604. In this embodiment, the spacing of the gaps 612 is varied, such that the gaps 612 are closer together near the edge of the transmission line 610. Such spacing of the gaps 612 can help balance the current flow across the transmission line 610, and thus lead to a more uniform feed of current into the IC die 604. Such a uniform current flow can improve the performance of the RF device 100.

In many RF applications, it is desirable to provide specific impedance matching at the input or output of the RF device. In a typical configuration, this impedance matching has been provided with the use of separate impedance matching circuits. These impedance matching circuits have traditionally been outside and separate from the RF device, or provided as integrated devices inside the RF device package. In either case the impedance matching provided by these circuits can require additional space and cost.

Figure 7B:
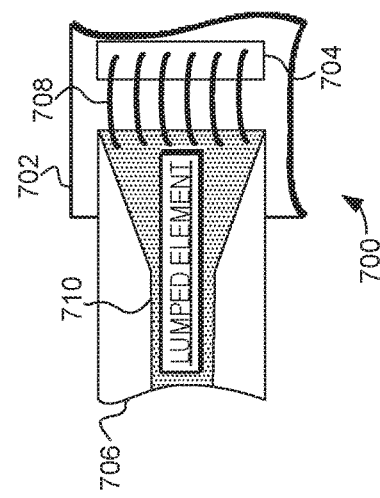
FIGS. 6-9 are top views of partial RF devices in accordance with an example embodiments.
Figure 7:
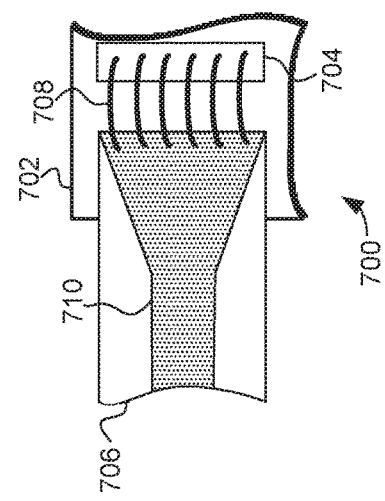

Turning now to FIG. 7, a schematic top view of a portion of an RF device 700 is illustrated. In this embodiment, the RF device 700 is contained in a package 702, of which a portion is illustrated. Inside the package 702 is an IC die 704. In accordance with the embodiments described herein, a flexible circuit lead 706 is coupled to the IC die 704, and used to provide an electrical connection to the IC die 704.

In the embodiment of FIG. 7, the flexible circuit lead 706 includes structures configured to provide distributed impedance matching. Specifically, a distributed impedance matching circuit 710 is integrated into the flexible circuit lead 706. In the illustrated example, the distributed impedance matching circuit 710 is a distributed tapered impedance transformer. In a distributed tapered impedance transformer, the wide end of the trace provides low impedance and the narrower end is transformed to a higher impedance. It should be noted that this is just one example of the type of impedance matching circuit 710 that could be provided. For example, in other cases the impedance matching could be provided with a combination of passive devices integrated on the flexible circuit lead 706 and lumped devices that are mounted on the flexible circuit lead 706 (see FIG. 7B).

In many RF applications, it is desirable to provide filtering to the inputs or outputs of an RF device. For example, these filters can be used to modify the operational bandwidth of the RF device. In some cases, these filters can be used to meet specific customer or regulatory requirements.

Figure 8:
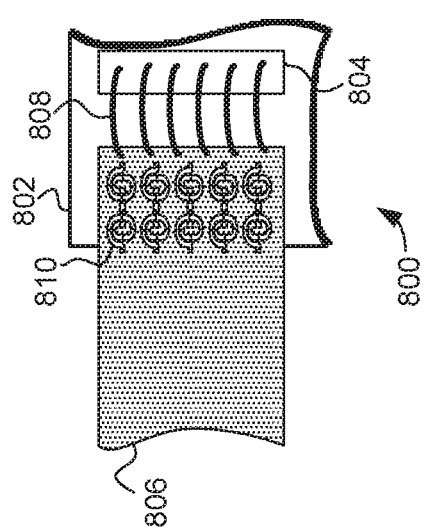

Turning now to FIG. 8, a schematic top view of a portion of an RF device 800 is illustrated. In this embodiment, the RF device 800 is contained in a package 802, of which a portion is illustrated. Inside the package 802 is an IC die 804. In accordance with the embodiments described herein, a flexible circuit lead 806 is coupled to the IC die 804, and used to provide an electrical connection to the IC die 804.

In the embodiment of FIG. 8, the flexible circuit lead 806 includes structures configured to provide filtering to the RF device 800. Specifically, a filter 810 is integrated into the flexible circuit lead 806. In the illustrated example, this filter 810 is formed with an arrangement of spiral inductors fabricated in the flexible circuit lead 806. It should be noted that this is just one example. In other cases, the filter 810 could be provided with a combination of passive devices integrated on the flexible circuit lead 806 and lumped devices that are mounted on the flexible circuit lead 806.

A variety of different types of filter 810 could be provided. For example, the filter 810 could include a stop band filter, low bass filter, band pass filter, or high pass filter. In one specific embodiment, the filter 810 is a stop band filter designed to meet customer or regulatory requirements. In such a case, using the filter 810 to meet these requirements provides additional flexibility. Specifically, the filter 810 can be added to the RF device 800 without changing the IC dies 804 or other elements inside the RF device 100. Thus, such filtering can be provided to those customers who need such filtering without requiring more involved and expensive changes to the IC die 804 or other similar changes inside the package 802.

As was noted above, the use of the flexible circuit lead can facilitate mounting discrete or packaged devices directly to the lead. This can be used to facilitate a variety of device configurations. For example, relatively large passive devices such as capacitors, inductors, and resistors can be mounted directly on the flexible circuit lead.

Figure 9:
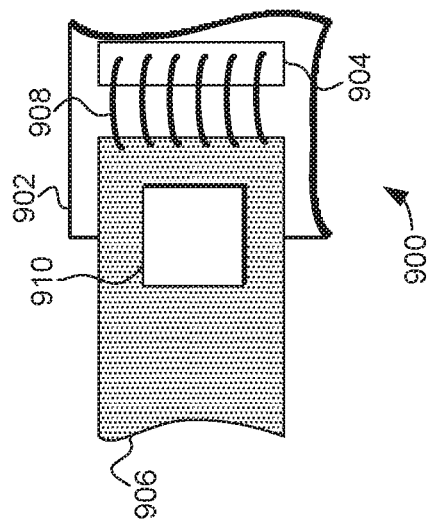

Turning now to FIG. 9, a schematic top view of a portion of an RF device 900 is illustrated. In this embodiment, the RF device 900 is contained in a package 902, of which a portion is illustrated. Inside the package 902 is an IC die 904. In accordance with the embodiments described herein, a flexible circuit lead 906 is coupled to the IC die 904, and used to provide an electrical connection to the IC die 904.

In the embodiment of FIG. 9, a device 910 is mounted on the flexible circuit lead 906. This device 910 can be any suitable device, including discrete and integrated devices. For example, the device 910 can include a relatively high capacitance surface mount capacitor. In such an embodiment, a high capacitance capacitor can be used to decouple power supply terminals on the RF device 900 from associated power supplies that are coupled to the flexible circuit lead 906. In such an embodiment, mounting the capacitor to the flexible circuit lead 906 reduces the distances between the capacitor and the RF device 900. This can reduce parasitic impedances, and thus improve the performance of the device. Again however, this is just one example of how such a device 910 mounted on the flexible circuit lead 906 could be used. And again it should be noted that the device 910 can be combined with other devices on the flexible circuit lead 906, including other devices mounted to the flexible circuit lead 906 or integrated in the flexible circuit lead 906.

The flexible circuit leads described above (e.g., leads 106, 206, 306, 406, 506, 606, 706, 806 and 906) can be formed of any suitable type of flexible circuit. For example, these flexible circuit leads can be formed with a suitable flexible base material and suitable conductive materials. Additionally, in some embodiments the flexible circuit leads can have one or more cover layers.

Turning now to FIG. 10, a cross-sectional side view of a portion of an exemplary flexible circuit lead 1000 is illustrated. The flexible circuit lead 1000 includes a flexible base material 1002, two conductive elements 1004, and two cover layers 1006. It should be noted that is just one example, and that other flexible circuit leads can have different configurations, including different numbers of conductive layers.

As one example, the flexible circuit lead 1000 can be formed by providing one or more dielectric flexible base layers 1002, and then depositing and patterning metal conductors (e.g., copper) to form the conductive elements 1004. The two cover layers 1006 can then deposited or laminated the conductive elements 1004. In the illustrated example a vertical interconnect 1008 and a landing pad 1010 are formed through the cover layers 1006. These elements are examples of the type of structures that can be formed to provide connection to the underlying conductive elements 1004. It should be noted that in some cases interconnects between interior layers could be provided.

As was discussed above, in some cases passive devices such as capacitors, inductors, and resistors can be formed in the flexible circuit lead 1000. Furthermore, in some cases more complex devices can be formed on the flexible circuit lead 1000. Examples of complex devices include transmission lines, impedance matching circuits, filters, base band decoupling circuits, bias networks, analog control networks (e.g., gate bias modulation and protection circuits).

Figure 11:
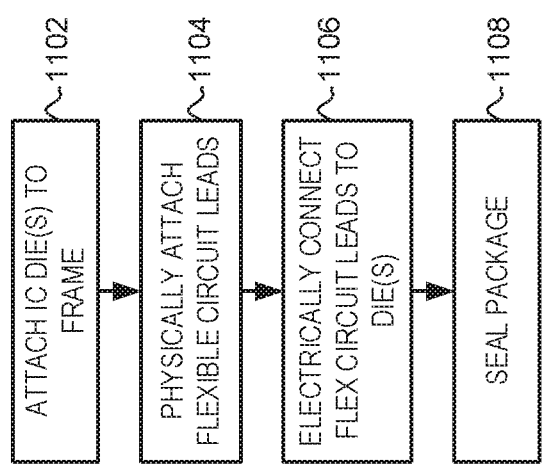
FIG. 11 is a flow diagram of a method in accordance with an example embodiment.

Turning now to FIG. 11, a method for forming an RF device is illustrated. The first step 1102 is to attach one or more IC dies (e.g., IC die 104, 204, 304, 404) to a package frame (e.g., frame 203, 303,403). For example, the IC die can be attached using sintering. In the general, a frame provides a mounting surface for the IC dies in the package, and can also provide a ground connection for the IC dies.

The next step 1104 is to physically attach one or more flexible circuit leads. Such attachment can be performed in a variety of ways. For example, the flexible circuit leads can be bonded with epoxy. In other embodiments, the flexible circuit lead can be pinned or clamped to provide a stronger mechanical joint. In one embodiment, the flexible circuit leads can be physically attached to an insulator on the package frame (e.g., insulator 210, 310, 410). In some embodiments, the flexible circuit leads can be physically attached the IC dies themselves.

The next step 1106 is to electrically connect the flexible circuit leads to the IC dies. In one embodiment, this electrical connection is provided by a plurality of wirebonds (e.g., wirebonds 208, 308, 408). The electrically connection between the flexible circuit leads can be direct, or it can be through an intermediate structure (e.g., interposer 212). In a typical embodiment, the IC dies will include appropriate pads for providing the electrical connection to the flexible circuit leads, whether through wirebonds or directly.

The next step 1108 is to seal the package. The technique used to seal the package would generally depend upon the type of package. For an overmolded package, the step of sealing would generally include overmolding the frame, IC dies, wirebonds, and a portion of the flexible circuit leads. For an air cavity package a package lid would generally be glued to an insulator such as a window frame.

The embodiments described herein thus provide RF devices that use flexible circuits to implement package leads. As described above, the use of the flexible circuits as package leads can significantly increase the performance of an RF device by allowing additional circuit elements to be located physically close to other device elements inside the package. As another example, the use of the flexible circuits as package leads can significantly increase the ability to customize an RF device.

In one embodiment, a radio-frequency device is provided, the device comprising: at least one integrated circuit (IC) die configured to implement the RF device; a package containing the at least one IC die; and a flexible circuit lead coupled to the at least one IC die inside the package and extending to outside the package, the flexible circuit lead comprising at least one flexible base layer and at least one conductor, the flexible circuit lead providing an electrical connection to the at least one IC die.

In another embodiment a method forming a radio-frequency device is provided, the method comprising the steps of: attaching at least one integrated circuit (IC) die configured to implement the RF device to a package, the package containing the at least one IC die; and coupling a flexible circuit lead to the at least one IC die, the flexible circuit lead extending from inside the package to outside the package, the flexible circuit lead comprising at least one flexible base layer and at least one conductor, the flexible circuit lead providing an electrical connection to the at least one IC die.

The preceding detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or the following detailed description.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first," "second" and other such numerical terms referring to structures do not imply a sequence or order unless clearly indicated by the context.

As used herein, a "node" means any internal or external reference point, connection point, terminal, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematics shown in the figures depict several exemplary arrangements of elements, additional intervening elements, devices, features, or components may be present in other embodiments of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A radio-frequency (RF) device comprising:
an integrated circuit (IC) die, the IC die including at least one RF amplifier to implement the RF device;
a package containing the IC die; and
a flexible circuit lead coupled to the IC die inside the package, the flexible circuit lead extending from inside the package to outside the package, the flexible circuit lead comprising at least one flexible base layer and at least one conductor, the flexible circuit lead providing an electrical connection to the at least one RF amplifier on the IC die, wherein the at least one conductor forms at least one passive device in a filter, with the filter electrically connected to the RF amplifier inside the package and through the flexible circuit lead.

2. The RF device of claim 1 wherein the at least one passive device formed with the least one conductor comprises a spiral inductor.

3. The RF device of claim 1 wherein the at least one passive device formed with the least one conductor comprises an inductor and a capacitor.

4. The RF device of claim 1 wherein the filter further includes at least one lumped passive element mounted on the flexible circuit lead.

5. The RF device of claim 1 wherein the at least one conductor in the flexible circuit lead further forms a transmission line in the flexible circuit lead such that the transmission line is electrically connected to the RF amplifier, and wherein the transmission line is formed to include a plurality of gaps spaced across the transmission line, the plurality of gaps formed to balance current flow across the transmission line.

6. The RF device of claim 1 wherein the at least one conductor further forms at least part of a distributed impedance matching circuit in the flexible circuit lead such that the distributed impedance matching circuit is electrically connected to the RF amplifier.

7. The RF device of claim 1 wherein the flexible circuit lead is electrically connected to the IC die inside the package with at least one wirebond.

8. The RF device of claim 1 wherein the flexible circuit lead is directly connected to the IC die inside the package.

9. A radio-frequency (RF) device comprising:
an integrated circuit (IC) die, the IC die including at least one RF amplifier to implement the RF device;
a package containing the IC die; and
a flexible circuit lead coupled to the IC die inside the package, the flexible circuit lead extending from inside the package to outside the package, the flexible circuit lead comprising at least one flexible base layer and at least one conductor, the flexible circuit lead providing an electrical connection to the at least one RF amplifier on the IC die wherein the at least one conductor forms at least one passive device in a distributed impedance matching circuit in the flexible circuit lead, with the distributed impedance matching circuit electrically connected to the RF amplifier inside the package and through the flexible circuit lead.

10. The RF device of claim 9 wherein the distributed impedance matching circuit includes a tapered impedance transformer formed in the at least one conductor in the flexible circuit lead.

11. The RF device of claim 9 wherein the at least one passive device formed with the least one conductor comprises a spiral inductor.

12. The RF device of claim 9 wherein the at least one conductor in the flexible circuit lead further forms a filter in the flexible circuit lead such that the filter is electrically connected to the RF amplifier.

13. The RF device of claim 9 wherein the distributed impedance matching circuit further includes at least one lumped passive element mounted on the flexible circuit lead.

14. The RF device of claim 9 wherein the flexible circuit lead is electrically connected to the IC die inside the package with at least one wirebond.

15. The RF device of claim 9 wherein the flexible circuit lead is directly connected to the IC die inside the package.

16. A radio-frequency (RF) device comprising:
 an integrated circuit (IC) die, the IC die including at least one RF amplifier to implement the RF device;
 a package containing the IC die; and
 a flexible circuit lead coupled to the IC die inside the package, the flexible circuit lead extending from inside the package to outside the package, the flexible circuit lead comprising at least one flexible base layer and at least one conductor, the flexible circuit lead providing an electrical connection to the at least one RF amplifier on the IC die wherein the at least one conductor forms at least one spiral inductor, with the at least one spiral inductor electrically connected to the RF amplifier inside the package and through the flexible circuit lead.

17. The RF device of claim 16 wherein the at least one spiral inductor comprises an arrangement of a plurality of spiral inductors formed from the at least one conductor.

18. The RF device of claim 16 further comprising at least one lumped passive element mounted on the flexible circuit lead.

19. The RF device of claim 16 wherein the flexible circuit lead is physically connected to the IC die inside the package.

20. The RF device of claim 16 wherein the flexible circuit lead is electrically connected to the IC die inside the package with at least one wirebond.

\* \* \* \* \*